United States Patent
Itakura et al.

(10) Patent No.: US 8,897,051 B2
(45) Date of Patent: Nov. 25, 2014

(54) SEMICONDUCTOR STORAGE DEVICE AND METHOD FOR PRODUCING THE SAME

(71) Applicant: J-Devices Corporation, Usuki (JP)

(72) Inventors: Satoru Itakura, Kawasaki (JP); Akio Katsumata, Kawasaki (JP); Akihiro Umeki, Kawasaki (JP); Yasushi Shiraishi, Kawasaki (JP); Junichiro Abe, Kawasaki (JP)

(73) Assignee: J-Devices Corporation, Usuki (JP)

( * ) Notice: Subject to any disclaimer, the term of this patent is extended or adjusted under 35 U.S.C. 154(b) by 0 days.

(21) Appl. No.: 14/052,864

(22) Filed: Oct. 14, 2013

(65) Prior Publication Data
US 2014/0104953 A1 Apr. 17, 2014

(30) Foreign Application Priority Data
Oct. 15, 2012 (JP) ................................. 2012-227643

(51) Int. Cl.
| | |
|---|---|
| *G11C 5/02* | (2006.01) |
| *G11C 5/06* | (2006.01) |
| *G11C 5/14* | (2006.01) |
| *G11C 7/00* | (2006.01) |
| *G11C 7/10* | (2006.01) |
| *G11C 16/30* | (2006.01) |
| *G06F 3/00* | (2006.01) |
| *H01L 25/065* | (2006.01) |
| *H01L 25/10* | (2006.01) |
| *H01L 25/18* | (2006.01) |
| *H01L 21/66* | (2006.01) |
| *G11C 11/4096* | (2006.01) |

(52) U.S. Cl.
CPC ............ *G11C 16/30* (2013.01); *G11C 11/4096* (2013.01); *G11C 5/06* (2013.01); *G11C 5/02* (2013.01); *G11C 5/063* (2013.01); *G11C 5/025* (2013.01); *G11C 7/10* (2013.01); *G11C 7/1069* (2013.01); *G06F 3/00* (2013.01); *H01L 25/0657* (2013.01); *H01L 25/105* (2013.01); *H01L 25/18* (2013.01); *H01L 22/10* (2013.01); *H01L 2224/16225* (2013.01); *H01L 2924/15311* (2013.01); *H01L 2924/19105* (2013.01)
USPC .......... 365/51; 365/189.17; 365/226; 365/167

(58) Field of Classification Search
CPC ............ G11C 5/02; G11C 5/025; G11C 5/06; G11C 5/063; G11C 7/1069; G11C 7/10; G11C 11/4096
USPC ......................... 365/51, 63, 189.17, 226, 164
See application file for complete search history.

(56) References Cited

U.S. PATENT DOCUMENTS

| | | | |
|---|---|---|---|
| 5,563,773 A | 10/1996 | Katsumata | |
| 5,977,641 A | 11/1999 | Takahashi et al. | |
| 6,363,450 B1 | 3/2002 | Lash et al. | |
| 2008/0025127 A1* | 1/2008 | Kanda et al. | ............. 365/230.01 |

(Continued)

FOREIGN PATENT DOCUMENTS

| | | |
|---|---|---|
| JP | 5-191028 | 7/1993 |
| JP | 6-350007 | 12/1994 |

(Continued)

OTHER PUBLICATIONS

Extended European Search Report mailed Nov. 21, 2013 in corresponding European Application No. 13188322.5.

*Primary Examiner* — Ly D Pham

(57) ABSTRACT

A semiconductor storage device 100 includes a controller package 110 having a BGA terminal on a bottom surface thereof; and one or a plurality of memory packages 120 each including a plurality of semiconductor storage elements and mounted on the controller package. The controller package includes a bottom substrate having the BGA terminal on a bottom surface thereof; a power supply IC, mounted on the bottom substrate, for supplying a plurality of power supplies; and a controller mounted on the bottom substrate and operable by the plurality of power supplies supplied from the power supply IC. The controller provides an interface with an external system via the BGA terminal and controls a read operation from the semiconductor storage elements and a write operation to the semiconductor storage elements.

5 Claims, 7 Drawing Sheets

(56) References Cited

U.S. PATENT DOCUMENTS

| | | |
|---|---|---|
| 2010/0238696 A1* | 9/2010 | Baek ............................... 365/51 |
| 2011/0211411 A1* | 9/2011 | Ide ................................. 365/219 |
| 2012/0025367 A1 | 2/2012 | Imaizumi et al. |
| 2012/0089766 A1 | 4/2012 | Yu et al. |
| 2012/0213022 A1* | 8/2012 | Yang et al. .................... 365/201 |
| 2013/0026650 A1 | 1/2013 | Yamagata et al. |
| 2013/0200523 A1 | 8/2013 | Sawachi et al. |

FOREIGN PATENT DOCUMENTS

| | | |
|---|---|---|
| JP | 7-30009 | 1/1995 |
| JP | 9-139441 | 5/1997 |
| JP | 9-153561 | 6/1997 |
| JP | 9-321203 | 12/1997 |
| JP | 10-313074 | 11/1998 |
| JP | 2001-35994 | 2/2001 |
| JP | 2003-264268 | 9/2003 |
| JP | 2007-258381 | 10/2007 |
| JP | 2010-118369 | 5/2010 |
| JP | 2012-33559 | 2/2012 |
| JP | 2013-30593 | 2/2013 |
| JP | 2013-162071 | 8/2013 |
| WO | WO 2008/076790 A2 | 6/2008 |

* cited by examiner

SEMICONDUCTOR STORAGE DEVICE AND METHOD FOR PRODUCING THE SAME

CROSS REFERENCE TO RELATED APPLICATION

This application is based upon and claims the benefit of priority from the prior Japanese Patent Application No. 2012-227643, filed on Oct. 15, 2012; the entire contents of which are incorporated herein by reference.

FIELD

The present invention relates to a semiconductor storage device and a method for producing the same. Specifically, the present invention relates to a semiconductor storage device including a nonvolatile semiconductor storage element such as a NAND-type flash memory or the like, a controller, a power supply IC, various types of passive elements and the like; and a method for producing the same.

BACKGROUND

Conventionally, a semiconductor storage device including a NAND-type flash memory and a controller has been produced and marketed. In such a semiconductor storage device, the controller provides an interface between a system and the NAND-type flash memory. In more detail, the controller provides logical address/physical address conversion of the NAND-type flash memory, data caching, an interface and the like. The interface provided by the controller may be a USB interface, a SATA interface or the like.

In such a semiconductor storage device, the NAND-type flash memory and the controller are stacked to form a module. Such modules were first formed actively in the field of semiconductor storage devices including a controller which provides a USB interface. By contrast, in the field of SSDs (Solid State Drives) in which the controller provides a SATA interface, it has been attempted merely recently to stack a NAND-type flash memory and a controller to form a module. A reason for this is that SSDs are expected to replace HDDs (Hard Disc Drives) and thus are required to have a structure including a stack of a plurality of NAND flash memories.

Recently, SSDs including a SATA interface that are directly mountable on a substrate have been produced and marketed. An SSD including a SATA interface has a BGA pattern having an array of a large number of solder balls on a bottom surface of the module. Such an SSD includes a multi-chip package in which a NAND-type flash memories and a controller are stacked.

Patent Document 1: Japanese Laid-Open Patent Publication No. 2001-35994

However, the conventional SSD including a SATA interface does not include a power supply IC or various types of passive elements. Therefore, the controller needs to be driven by the same external power supply as that for the NAND-type flash memories. This causes problems that a lower level of power supply voltage cannot be used for the controller and that a plurality of power supplies cannot be provided for the NAND-type flash memories. In addition, since the SSD includes the multi-chip package, a test needs to be performed after the SSD is sealed with a resin. This makes it difficult to guarantee a high total yield, which includes the yield of the controller and the yield of the NAND-type flash memories.

The present invention made in light of the above-described problems has an object of providing a semiconductor storage device in which a power supply IC and various types of passive elements are provided in the form of a module, a lower level of power supply voltage can be used for a controller, and a plurality of power supplies can be provided for the controller and NAND flash memories. The present invention also has an object of providing a method for producing such a semiconductor storage device, which can realize a sufficiently high total yield.

SUMMARY

In order to solve the above-described problems, a semiconductor storage device in one embodiment according to the present invention comprises a controller package having a BGA terminal on a bottom surface thereof; and one or a plurality of memory packages each including a plurality of semiconductor storage elements and mounted on the controller package. (A) The controller package includes a bottom substrate having the BGA terminal on a bottom surface thereof; a power supply IC, mounted on the bottom substrate, for supplying a plurality of power supplies; and a controller mounted on the bottom substrate and operable by the plurality of power supplies supplied from the power supply IC, the controller providing an interface with an external system via the BGA terminal and controlling a read operation from the semiconductor storage elements and a write operation to the semiconductor storage elements. A memory terminal pattern for mounting the one or plurality of memory packages thereon is formed on a top surface of the controller package, the memory terminal pattern being connected to the controller. (B) The one or plurality of memory packages are mounted on, and electrically connected to, the memory terminal pattern.

The controller may include an external interface interfacing with the external system; and a core unit for controlling the read operation and the write operation. The external interface unit may be supplied with a first power supply voltage from the power supply IC, and the core unit may be supplied with a second power supply voltage from the power supply IC.

The controller may further include a memory interface unit for interfacing with the semiconductor storage elements; the semiconductor storage elements may each include a controller interface unit for interfacing with the controller and a memory core unit for storing information; and the memory interface unit and the controller interface unit may each be supplied with a third power supply voltage from the power supply IC.

The BGA terminal may include a plurality of terminals located in a prescribed pattern; a part of the plurality of terminals may be used for interfacing with the external system or for supplying a power supply; and another part of the plurality of terminals may include dummy terminals which are not used for interfacing or providing a power supply.

Furthermore, in order to solve the above-described problems, a method for producing a semiconductor storage device in one embodiment according to the present invention is a method for producing a semiconductor storage device as follows. The semiconductor storage device includes a controller package having a BGA terminal on a bottom surface thereof; and one or a plurality of memory packages each including a plurality of semiconductor storage elements and mounted on the controller package. The controller package includes a bottom substrate having the BGA terminal on a bottom surface thereof; a power supply IC, mounted on the bottom substrate, for supplying a plurality of power supplies; and a controller mounted on the bottom substrate and operable by the plurality of power supplies supplied from the power supply IC, the controller providing an interface with an external system via the BGA terminal and controlling a read operation from the semiconductor storage elements and a write operation to the semiconductor storage elements. A memory terminal pattern for mounting the one or plurality of memory packages thereon is formed on a top surface of the controller package, the memory terminal pattern being connected to the controller. The method for producing the semiconductor storage device comprises stacking and connecting the controller package selected as being good by a first test and the one or plurality of memory packages selected as being good by a second test.

The present invention can provide a semiconductor storage device in which a power supply IC and various types of passive elements are provided in the form of a module, a lower level of power supply voltage can be used for a controller, and a plurality of power supplies can be provided for the controller and NAND flash memories. The present invention can also realize a sufficiently high total yield.

DESCRIPTION OF EMBODIMENTS

Figure 1:
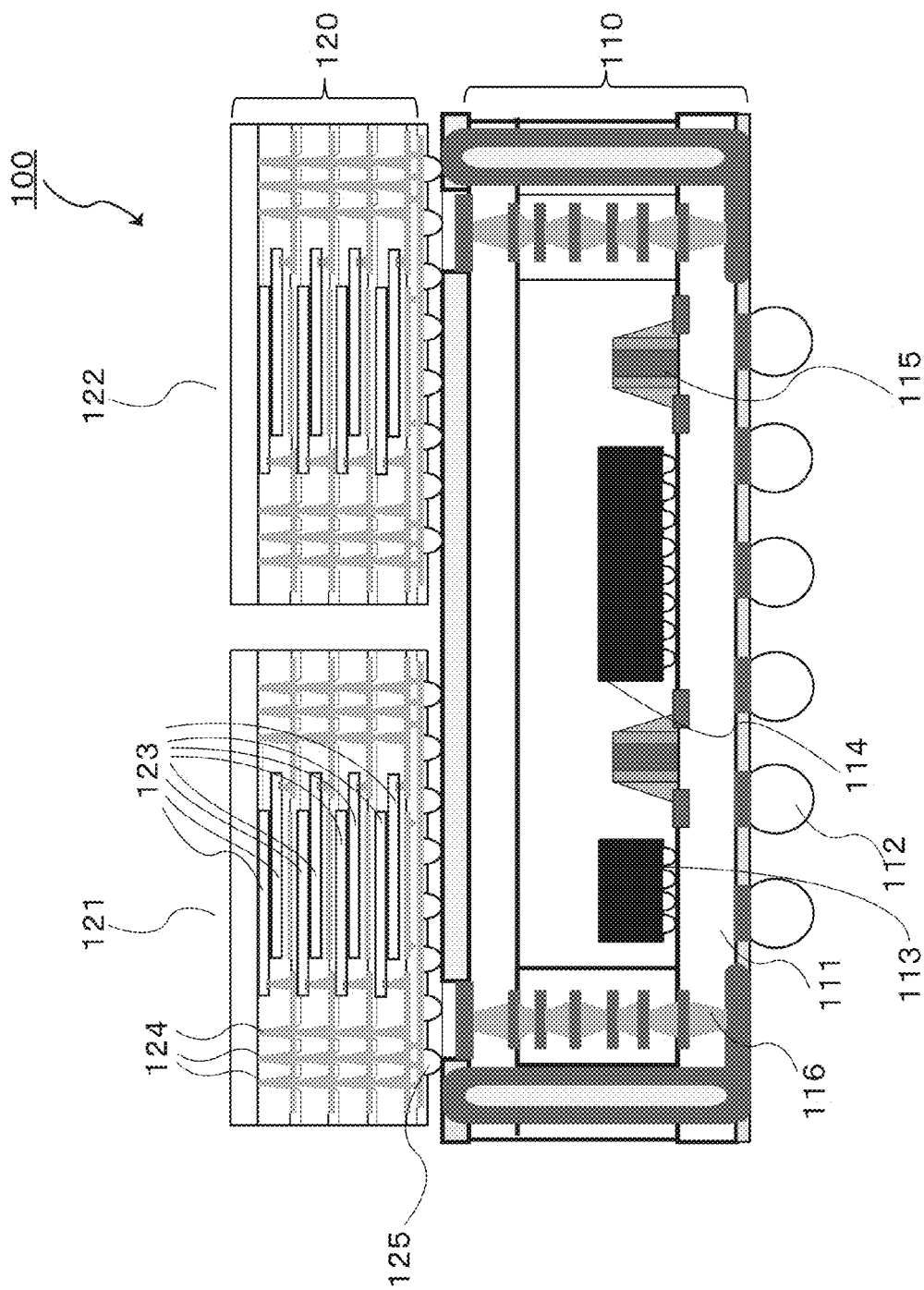
FIG. 1 is a cross-sectional view of a semiconductor storage device in one embodiment according to the present invention.

Hereinafter, an embodiment of the present invention will be described with reference to FIG. 1 through FIG. 8. In the embodiment, identical components will bear identical reference numerals, and the same descriptions will not be repeated.

FIG. 1 is a cross-sectional view of a semiconductor storage device 100 in one embodiment according to the present invention. The semiconductor storage device 100 includes a controller package 110 and a memory package 120 which are stacked.

Figure 8:
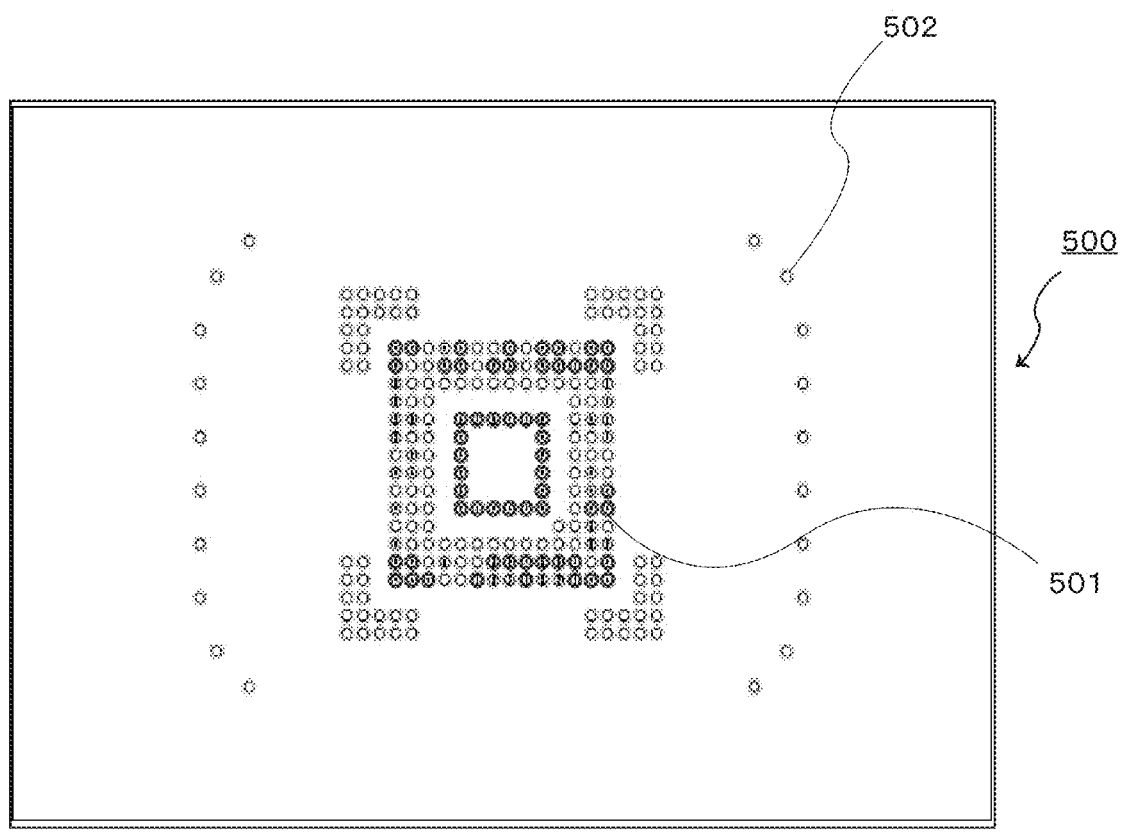
FIG. 8 shows a bottom surface pattern of the controller package in one embodiment according to the present invention.

The controller package 110 includes a bottom substrate 111 formed of a glass reinforced epoxy substrate (PCB). On a bottom surface (lower surface in the figure) of the bottom substrate, a BGA pattern having an array of a large number of solder ball electrodes 112 is formed. FIG. 8 shows an example of the BGA pattern. The semiconductor storage device 100 is surface-mounted on a surface (not shown) with the solder balls electrodes 112 being held therebetween.

Figure 7:
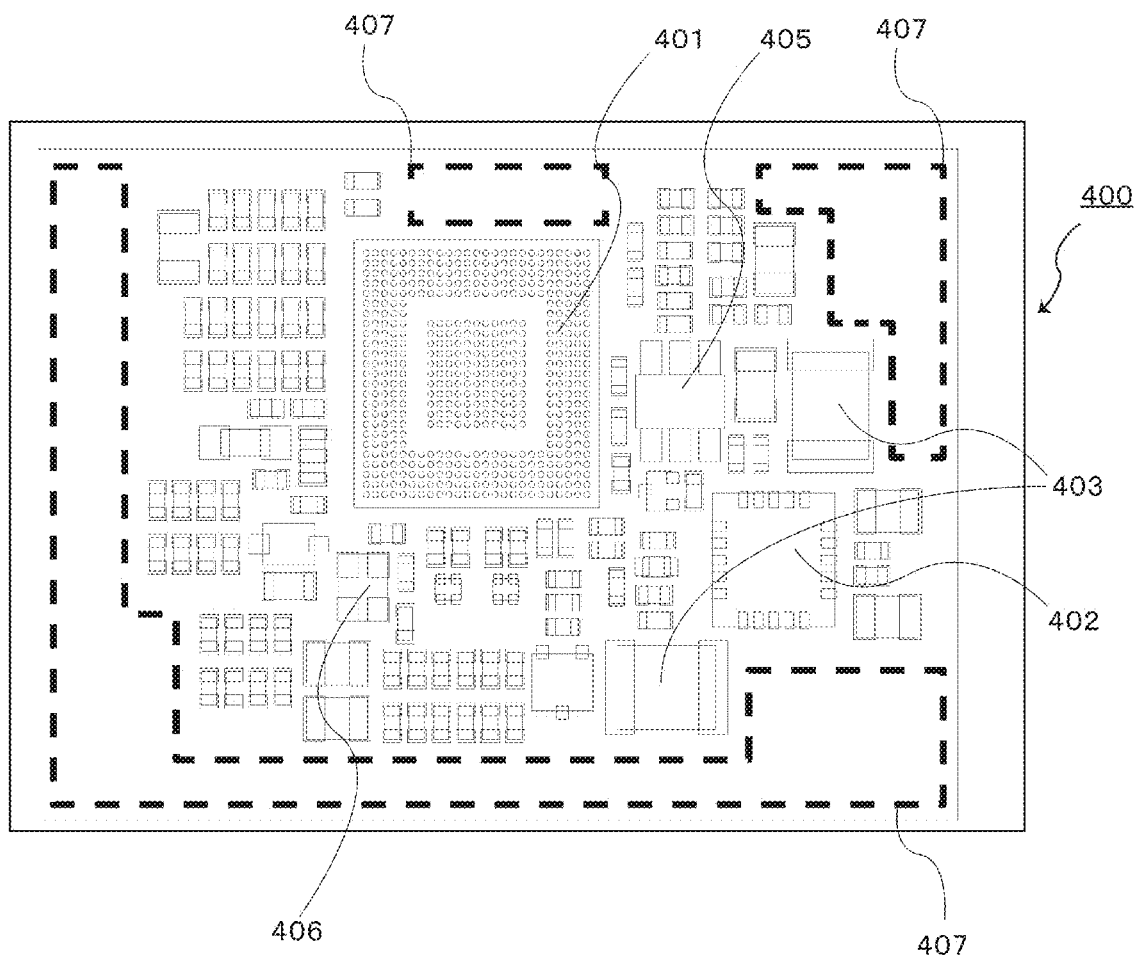
FIG. 7 shows an arrangement pattern of components in the controller package in one embodiment according to the present invention.

On the substrate 111, various types of circuit elements such as a power supply IC 113, a controller 114, passive elements 15 and the like are mounted. FIG. 7 shows an example of arrangement of these surface-mounted components. These circuit elements are sealed by a resin such as an epoxy resin or the like. Conductive vertical connection pillars 116 are formed so as to run through the controller package 110 from a top surface to a bottom surface thereof in an area where no circuit element is formed. The pillars 116 are connected to the BGA pattern on the substrate 111.

Figure 2:
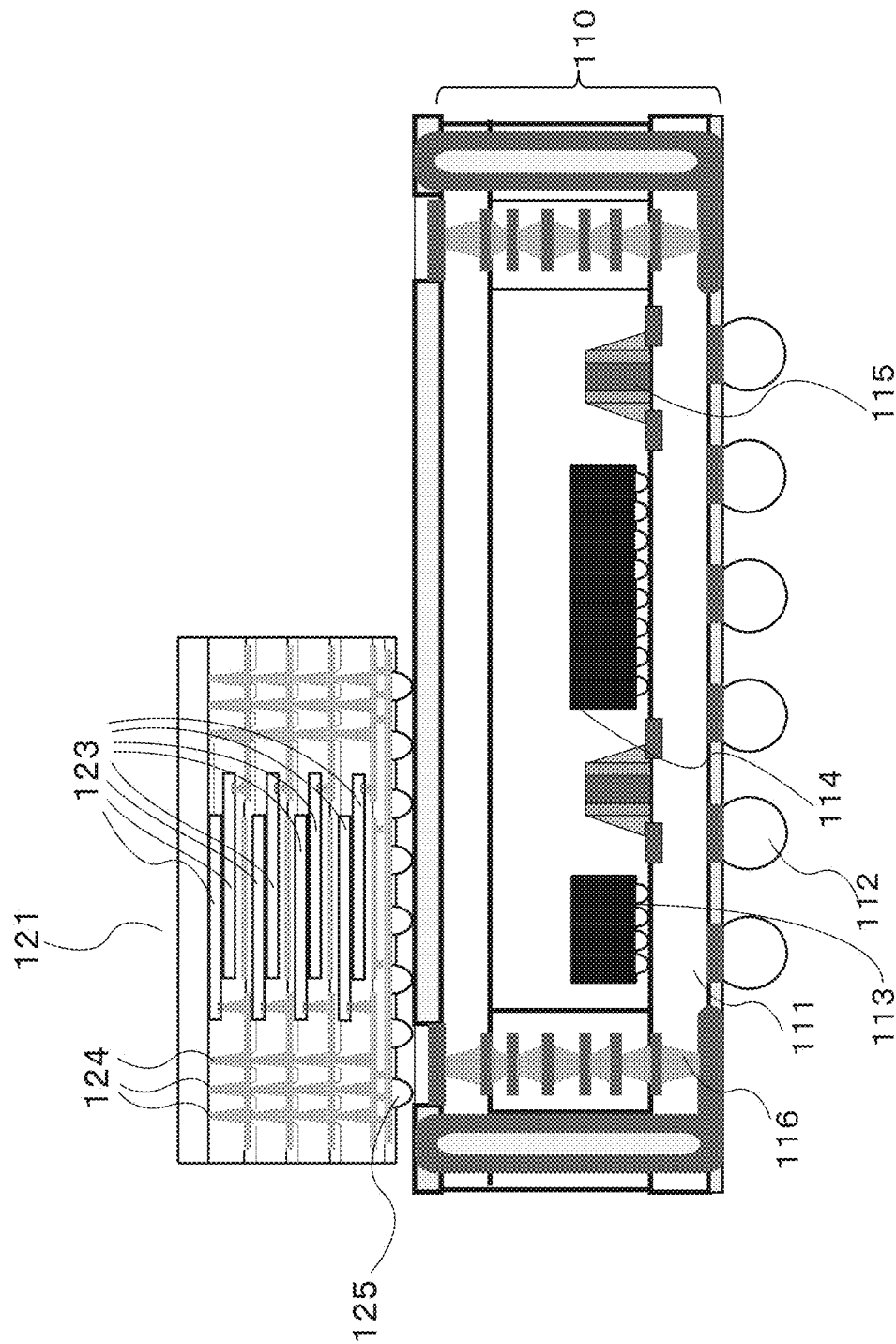
FIG. 2 is a cross-sectional view of an example of the semiconductor storage device in one embodiment according to the present invention, in which the capacity of NAND-type flash memories included in the semiconductor storage device is decreased.
Figure 6:
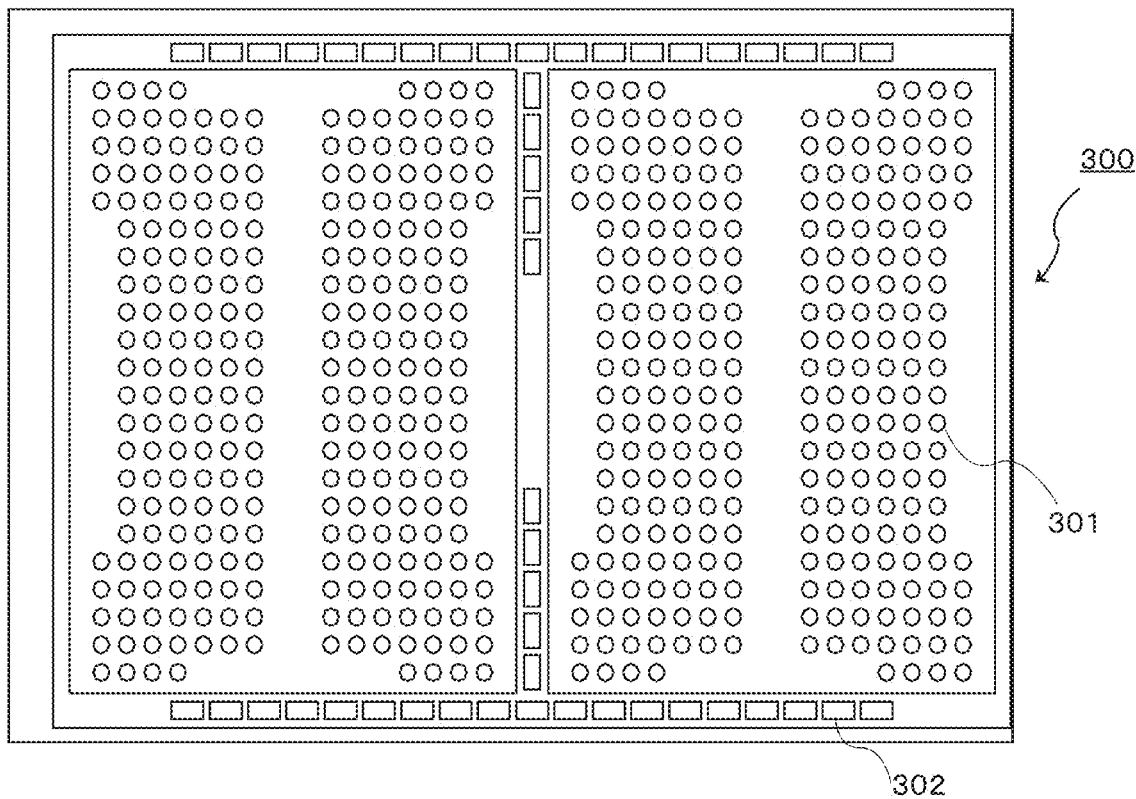
FIG. 6 shows a top surface pattern of a controller package in one embodiment according to the present invention.

At the top surface of the controller package 110, a top substrate is formed. On a top surface of the top substrate, an electrode pattern including a large number of electrodes for mounting the memory package 120 thereon is formed. FIG. 6 shows an example of the electrode pattern. The electrode pattern on the top substrate is connected to the pillars 116. On the top substrate, one or a plurality of memory packages 121 and 122 are mountable. FIG. 1 shows an example in which two memory packages are mounted. FIG. 2 shows an example in which one memory package is mounted.

The memory package 121 includes a stack of eight NAND-type flash memory chips 123. Two NAND-type flash memory chips 123 are stacked as being shifted from each other to protrude in opposite directions such that electrode portions thereof are exposed, and are flip-chip-bonded. The memory chip package 121 includes four pairs of such NAND-type flash memory chips 123 which are stacked such that the NAND-type flash memory chips 123 are shifted to protrude in opposite directions alternately. The chips are connected by pillars 124. On a bottom surface of the memory package 121, solder balls 125 are formed.

Figure 3:
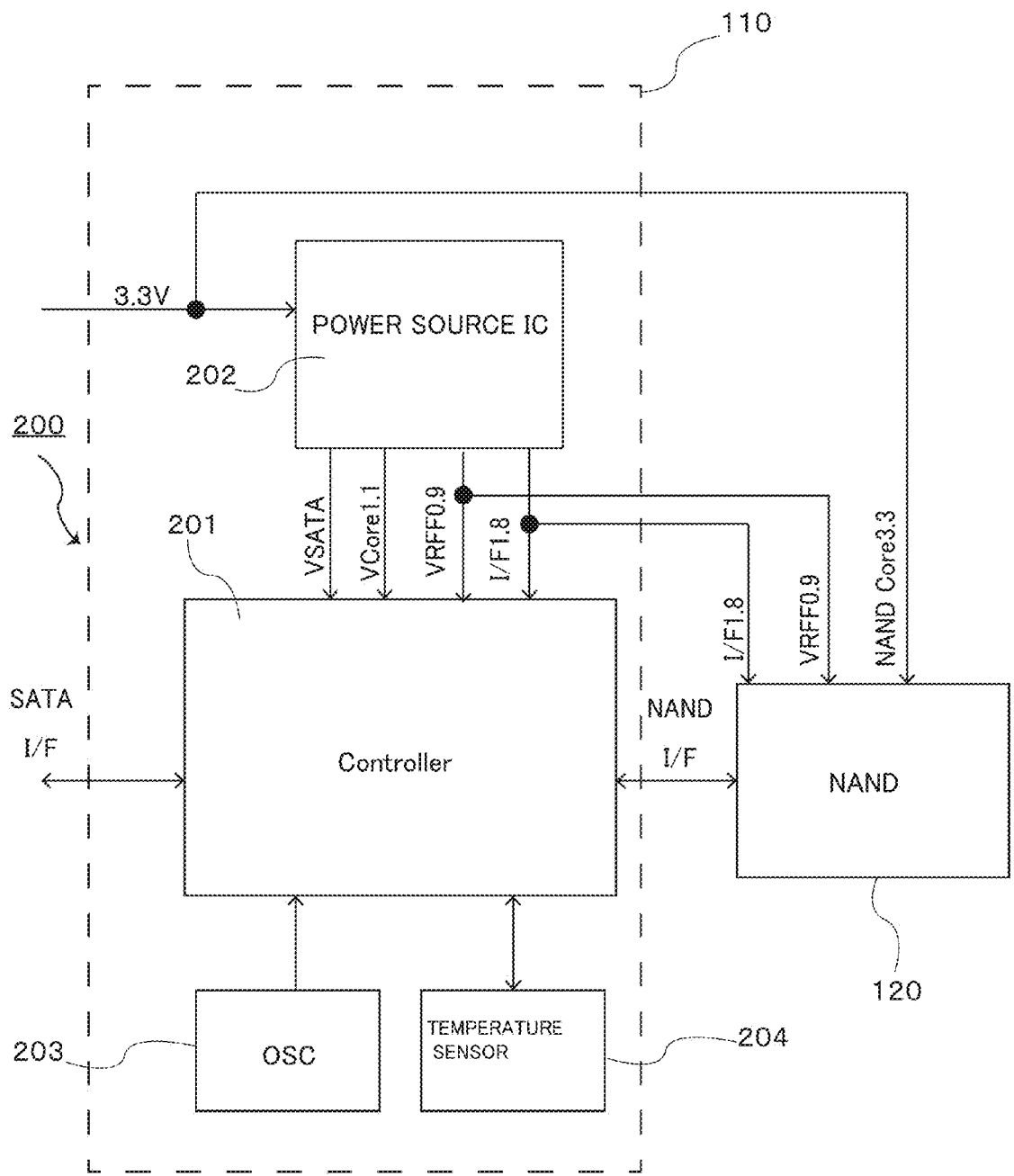
FIG. 3 shows a circuit configuration in one embodiment according to the present invention.

FIG. 3 shows a circuit configuration 200 of the semiconductor storage device 100 in one embodiment according to the present invention. The controller package 110 includes a power supply IC 202 for generating four power supplies of VSATA (5 V), Core 1.1 (1.1 V), I/F 1.8 (1.8 V) and VREF 0.9 (0.9 V) from a 3.3 V power supply externally supplied, and also includes an inductor (not shown). The controller package 110 also includes a controller 201 which is operable by a power supply supplied from the power supply IC 202. The controller 201 provides an interface with an external system via the BGA terminals on the bottom substrate, and controls a read operation from, and a write operation to, the NAND-type flash memories 123. The controller 201 is connected to a quartz oscillator 203, a capacitor (not shown) and a temperature sensor 204.

The memory package 120 is operable by the 3.3 V power supply externally supplied, and the I/F 1.8 (1.8 V) and the VREF 0.9 (0.9 V) supplied from the power supply IC 202.

Figure 4:
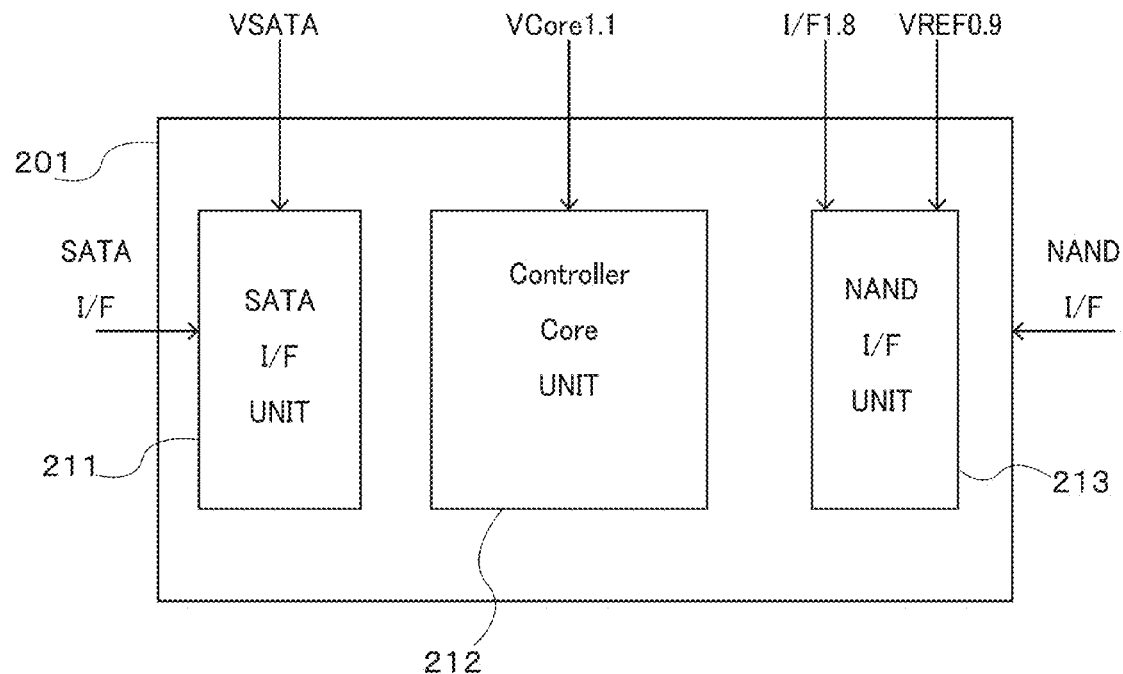
FIG. 4 shows a circuit configuration of a controller in one embodiment according to the present invention.

FIG. 4 shows a circuit configuration of the controller 201. The controller 201 includes a SATA interface unit 211, a controller core unit 212, a NAND interface unit 213.

The SATA interface unit 211 is connected to the external system via the BGA terminal of the bottom substrate, and communicates with the external system by a protocol of the SATA standard. The SATA interface unit 211 is supplied with VSATA (5 V).

The controller core unit 212 generates various types of control signals for the NAND-type flash memories, caches data, and performs logical address/physical address conversion. The controller core unit 212 also disperses data write (wear leveling) such that an operation of writing data to, and erasing data from, the NAND-type flash memories is performed uniformly. As can be seen, the controller core unit 212 has many functions and therefore has a large circuit scale, which decreases the power supply voltage to 1.1 V. Thus, the controller core unit 212 is supplied with Core 1.1 (1.1 V).

The NAND interface unit 213 interfaces with the NAND-type flash memories via the terminals on the top substrate. An exchange of a control signal or data with the NAND-type flash memories is performed by use of a signal of 1.8 V at a high level or a signal of 0 V at a low level. VERF 0.9 (0.9 V) is used as a reference voltage or a threshold voltage. Thus, the NAND interface unit 213 is supplied with I/F 1.8 (1.8 V) and VREF 0.9 (0.9 V).

Figure 5:
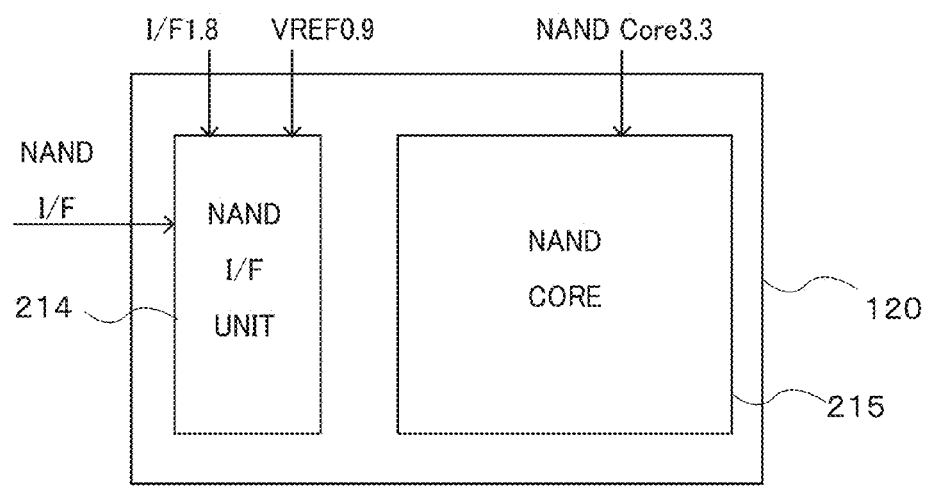
FIG. 5 shows a circuit configuration of a memory package in one embodiment according to the present invention.

FIG. 5 shows a circuit configuration of the memory package 120. The memory package 120 includes a NAND interface unit 214 and a NAND core 215.

The NAND interface unit 214 communicates with the NAND interface unit 213 of the controller 201 by use of a NAND interface protocol. Such an exchange of a control signal or data is performed by use of a signal of 1.8 V at a high level or a signal of 0 V at a low level. VERF 0.9 (0.9 V) is used as a reference voltage or a threshold voltage. Thus, the NAND interface unit 214 is supplied with I/F 1.8 (1.8 V) and VREF 0.9 (0.9 V).

The NAND core 215 includes NAND-type memory cells arrayed in rows by columns, a row decoder for driving the NAND-type memory cells, a sense amplifier/latch circuit, a circuit for controlling these components, and various types of power supply circuits. Since read, write and erase operations each require a power supply voltage of 3.3 V, the NAND core 215 is supplied with 3.3 V directly from a SATA terminal of the external system.

FIG. 6 shows a top surface pattern 300 of the controller package 110. On the top surface of the controller package 110, two memory packages 121 and 122 are mountable. Each of the memory packages 121 and 122 allows eight NAND-type flash memories 123 to operate in parallel, and also exchanges signals at the same time. The top surface pattern 300 includes terminals 301 of a number required therefor. In order to allow the eight NAND-type flash memories 123 to operate in parallel, a large number of capacitors 302 having a relatively large capacitance, which prevent the power supplies, especially the 3.3 V power supply, from including noise, are formed on the top surface of the controller package 110. The capacitors 302 are mounted on the controller package 110 at the same time as the memory packages 121 and 122.

FIG. 7 shows a conceptual image of arrangement of components in the controller package 110. At substantially the center position, a terminal pattern 401 for mounting the controller 201 is located. In the vicinity thereof, a terminal pattern 406 mounting the quartz oscillator 203 and a terminal pattern 405 mounting the temperature sensor 204 are located. In addition, a terminal pattern 402 mounting the power supply IC 202 is located, and a terminal pattern 403 mounting the inductor is located in the vicinity thereof. There are also areas 407 in which the pillars 116 for electrically connecting the bottom substrate and the top substrate to each other are to be located.

FIG. 8 shows the BGA pattern on the bottom substrate. The BGA pattern includes a matrix-like pattern 501 and a pattern 502 surrounding the matrix-like pattern 501. In an inner part of the matrix-like pattern 501, the solder balls are arrayed sparsely. Only a small part of the solder balls in the BGA pattern is actually used as the SATA signal terminal or the power supply terminal, and a most part of the BGA pattern is a dummy pattern.

Owing to the above-described structure, the semiconductor storage device 100 in one embodiment according to the present invention provides at least one of the following effects.

(1) According to the semiconductor storage device of the present invention, the power supply IC and various types of passive elements are provided in the form of a module, a lower level of power supply voltage can be used for the controller, and a plurality of power supplies can be provided for the controller and the NAND flash memories. Specifically, even if one 3.3 V voltage is supplied from the external system, different power supply voltages can be generated in the controller package for the SATA interface, the controller core, and the NAND interface. This realizes a lower voltage for the controller unit, lower power consumption, and higher functions at the same time.

(2) The controller which can act as a heat source is present in a lower part of the semiconductor storage device and is connected to the substrate via the BGA pattern including a large number of solder balls in the dummy pattern. Therefore, the heat radiation efficiency is higher than that in the case where the controller package is located in an upper part of the semiconductor storage device.

(3) According to a method for producing a semiconductor storage device in one embodiment of the present invention, controller packages and memory packages are tested separately, and good items are chosen as a controller package and a plurality of memory packages. The controller package and the plurality of memory packages selected as being good are stacked and connected. This improves the total yield. Hereinafter, this will be described specifically.

The controller 114, which is a component of the controller package 110, is obtained and treated as follows. A controller 114 selected as a good item by a test performed thereon in a wafer state is sealed with a resin as a BGA package. The power supply IC 113 is obtained and treated in substantially the same manner.

Next, the controller 114, the power supply IC 113 and various types of passive elements are mounted on the bottom substrate, and are sealed with a resin to form the controller package 110. In this state, the controller package 110 is subjected to a test (test 1) performed for selecting a good item.

NAND-type flash memories are tested in a wafer state, and only the NAND-type flash memories selected as good items are stacked to form the memory package 120. The resultant memory package 120 is subjected to a test (test 2) performed for selecting a good item.

The controller package 110 selected by test 1 and the memory package 120 selected by test 2 are stacked. Thus, the semiconductor storage device 100 is obtained.

Owing to the above-described structure, the method for producing a semiconductor storage device in one embodiment according to the present invention provides an effect that a sufficiently high total yield is obtained as described above in (3).

What is claimed is:

1. A semiconductor storage device, comprising:
  a controller package having a BGA terminal on a bottom surface thereof; and
  one or a plurality of memory packages each including a plurality of semiconductor storage elements and mounted on the controller package;
  wherein:
  (A) the controller package includes:
    a bottom substrate having the BGA terminal on a bottom surface thereof;
    a power supply IC, mounted on the bottom substrate, for supplying a plurality of power supplies; and
    a controller mounted on the bottom substrate and operable by the plurality of power supplies supplied from the power supply IC, the controller providing an interface with an external system via the BGA terminal and controlling a read operation from the semiconductor storage elements and a write operation to the semiconductor storage elements;

wherein a memory terminal pattern for mounting the one or plurality of memory packages thereon is formed on a top surface of the controller package, the memory terminal pattern being connected to the controller; and (B) the one or plurality of memory packages are mounted on, and electrically connected to, the memory terminal pattern.

2. A semiconductor storage device according to claim 1, wherein the controller includes:
an external interface interfacing with the external system; and
a core unit for controlling the read operation and the write operation;
wherein the external interface unit is supplied with a first power supply voltage from the power supply IC, and the core unit is supplied with a second power supply voltage from the power supply IC.

3. A semiconductor storage device according to claim 2, wherein:
the controller further includes a memory interface unit for interfacing with the semiconductor storage elements;
the semiconductor storage elements each include a controller interface unit for interfacing with the controller and a memory core unit for storing information; and
the memory interface unit and the controller interface unit are each supplied with a third power supply voltage from the power supply IC.

4. A semiconductor storage device according to claim 1, wherein:
the BGA terminal includes a plurality of terminals located in a prescribed pattern;
a part of the plurality of terminals is used for interfacing with the external system or for supplying a power supply; and
another part of the plurality of terminals includes dummy terminals which are not used for interfacing or providing a power supply.

5. A method for producing a semiconductor storage device, comprising:
providing the semiconductor storage device including:
a controller package having a BGA terminal on a bottom surface thereof; and
one or a plurality of memory packages each including a plurality of semiconductor storage elements and mounted on the controller package;
wherein the controller package includes:
a bottom substrate having the BGA terminal on a bottom surface thereof;
a power supply IC, mounted on the bottom substrate, for supplying a plurality of power supplies; and
a controller mounted on the bottom substrate and operable by the plurality of power supplies supplied from the power supply IC, the controller providing an interface with an external system via the BGA terminal and controlling a read operation from the semiconductor storage elements and a write operation to the semiconductor storage elements;
wherein a memory terminal pattern for mounting the one or plurality of memory packages thereon is formed on a top surface of the controller package, the memory terminal pattern being connected to the controller; and
stacking and connecting the controller package selected as being good by a first test and the one or plurality of memory packages selected as being good by a second test.

* * * * *